(12) United States Patent
Kim et al.

(10) Patent No.: US 11,018,038 B2
(45) Date of Patent: May 25, 2021

(54) APPARATUS FOR SAWING A SEMICONDUCTOR PACKAGE

(71) Applicant: SAMSUNG ELECTRONICS CO., LTD., Suwon-si (KR)

(72) Inventors: Yong Ki Kim, Asan-si (KR); Yo Se Eum, Cheonan-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 35 days.

(21) Appl. No.: 16/460,534

(22) Filed: Jul. 2, 2019

(65) Prior Publication Data

US 2020/0111691 A1 Apr. 9, 2020

(30) Foreign Application Priority Data

Oct. 5, 2018 (KR) .................. 10-2018-0118738

(51) Int. Cl.
*H01L 21/677* (2006.01)
*H01L 21/683* (2006.01)
*H01L 21/78* (2006.01)
*H01L 21/67* (2006.01)
*H01L 21/68* (2006.01)
*H01L 21/687* (2006.01)

(52) U.S. Cl.
CPC .. *H01L 21/67721* (2013.01); *H01L 21/67092* (2013.01); *H01L 21/68* (2013.01); *H01L 21/6838* (2013.01); *H01L 21/68742* (2013.01); *H01L 21/78* (2013.01); *Y10T 83/207* (2015.04); *Y10T 83/2185* (2015.04); *Y10T 83/748* (2015.04)

(58) Field of Classification Search
CPC ............... Y10S 83/9291; Y10T 83/748; Y10T 83/7487; Y10T 83/0333; Y10T 83/207; Y10T 83/2092; Y10T 83/2185; H01L 21/67721; H01L 21/67092; H01L 21/68; H01L 21/6838; H01L 21/68742; H01L 21/78; H01L 21/00; H01L 21/67; H01L 21/67005; H01L 21/67242; H01L 21/673; H01L 21/677; H01L 21/67703; H01L 21/67706; H01L 21/687; H01L 21/683
See application file for complete search history.

(56) References Cited

U.S. PATENT DOCUMENTS 4,473,455 A * 9/1984 Dean ...................... C23C 14/50
118/50.1
5,803,972 A 9/1998 Sato et al.
5,865,319 A 2/1999 Okuda et al.
7,424,143 B2 9/2008 Hwang
(Continued)

FOREIGN PATENT DOCUMENTS

JP 2006-319125 11/2006
JP 2008-016676 1/2008
(Continued)

*Primary Examiner* — Phong H Nguyen
(74) *Attorney, Agent, or Firm* — F. Chau & Associates, LLC

(57) ABSTRACT

A semiconductor package sawing device is provided that includes a semiconductor package sawing unit, an automatic tool providing portion disposed adjacent to the semiconductor package sawing unit, and a semiconductor package alignment portion. The automatic tool providing portion includes a transfer unit for transferring a chuck unit to the semiconductor package sawing unit.

17 Claims, 13 Drawing Sheets

(56) References Cited

U.S. PATENT DOCUMENTS

| | | | |
|---|---|---|---|
| 9,117,869 B2* | 8/2015 | Kusunose | H01L 21/6838 |
| 2002/0179079 A1* | 12/2002 | Sekiya | H01L 21/67092 |
| | | | 125/13.01 |
| 2004/0265100 A1* | 12/2004 | Ohkawara | H01L 21/681 |
| | | | 414/416.03 |
| 2005/0150860 A1* | 7/2005 | Fujisawa | H01L 21/67069 |
| | | | 216/2 |
| 2015/0311059 A1 | 10/2015 | Kim et al. | |
| 2016/0099166 A1* | 4/2016 | Yudovsky | H01L 21/68764 |
| | | | 29/559 |

FOREIGN PATENT DOCUMENTS

| | | |
|---|---|---|
| JP | 2018-046060 | 3/2018 |
| KR | 10-2005-0106668 | 11/2005 |
| KR | 10-0982478 | 9/2010 |
| KR | 10-1281698 | 6/2013 |
| KR | 10-1604782 | 3/2016 |
| KR | 10-1810082 | 12/2017 |

* cited by examiner

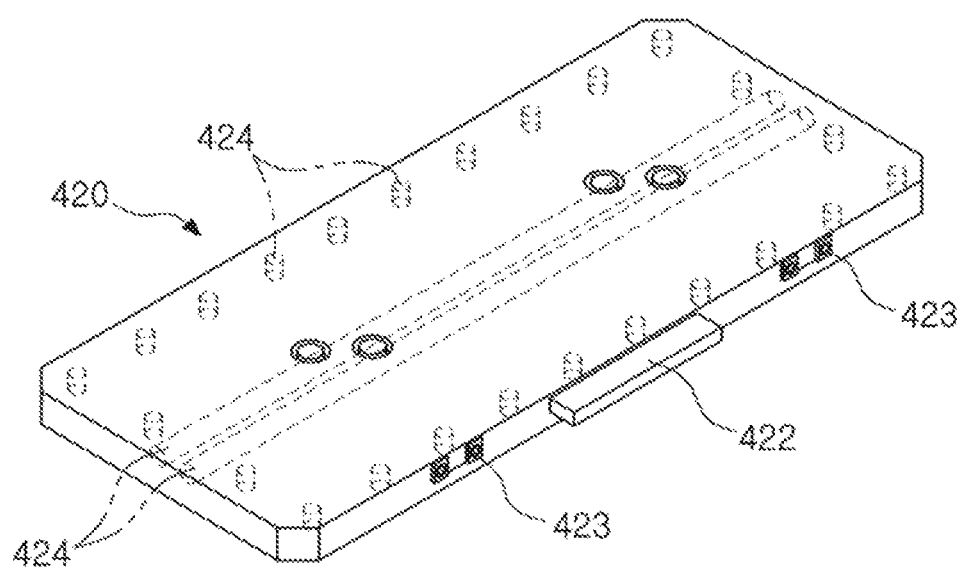
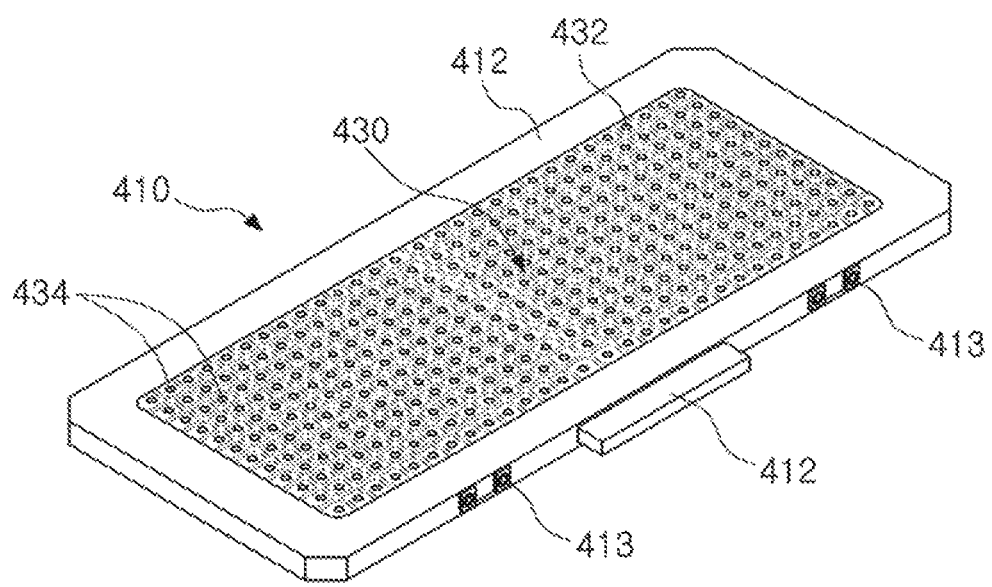
FIG. 9

APPARATUS FOR SAWING A SEMICONDUCTOR PACKAGE

CROSS-REFERENCE TO RELATED APPLICATION

This application claims priority under 35 U.S.C. § 119 to Korean Patent Application No. 10-2018-0118738 filed on Oct. 5, 2018 in the Korean Intellectual Property Office, the disclosure of which is incorporated by reference herein in its entirety.

TECHNICAL FIELD

Exemplary embodiments of the present inventive concept relate to an apparatus for sawing semiconductor packages.

DESCRIPTION OF RELATED ART

In general, a plurality of semiconductor packages are integrally manufactured, and then they are cut by a semiconductor package sawing unit to form individual semiconductor packages. There are various types of manufactured semiconductor packages which may be cut using different chucks. Therefore, an operator may have to replace a chuck currently installed in a semiconductor package sawing unit with the chuck needed for a particular semiconductor package.

SUMMARY

According to an exemplary embodiment of the present inventive concept, a semiconductor package sawing device is provided that includes a semiconductor package sawing unit, an automatic tool providing portion disposed adjacent to the semiconductor package sawing unit, and a semiconductor package alignment portion. The automatic tool providing portion includes a transfer unit for transferring a chuck unit to the semiconductor package sawing unit.

According to an exemplary embodiment of the present inventive concept, a semiconductor package sawing device is provided that includes a semiconductor package sawing unit, automatic tool providing portion may be disposed adjacent to the semiconductor package sawing, unit including a chuck supply area. A fixing chuck may be disposed in the chuck supply area for securing a chuck. A semiconductor package alignment portion may be disposed adjacent to semiconductor package sawing unit or the automatic tool providing portion. A transfer unit may be coupled to the automatic tool providing portion for transferring a chuck unit disposed on the fixing chuck. A mounting member may be coupled to the transfer unit. A transferring auxiliary member may be detachably coupled to a surface of the mounting member. A chuck recognition portion may be disposed at a side surface of the mounting member. A control unit may be connected to the mounting member.

BRIEF DESCRIPTION OF DRAWINGS

The above and other features of the present inventive concept will be more clearly understood by describing in detail exemplary embodiments thereof with reference to the accompanying drawings, in which:

FIG. 9 is a schematic exploded perspective view illustrating a chuck unit for a semiconductor package according to an exemplary embodiment of the present inventive concept;

DETAILED DESCRIPTION OF THE EMBODIMENTS

Hereinafter, exemplary embodiments of the present inventive concept will be described with reference to the accompanying, drawings.

Figure 1:
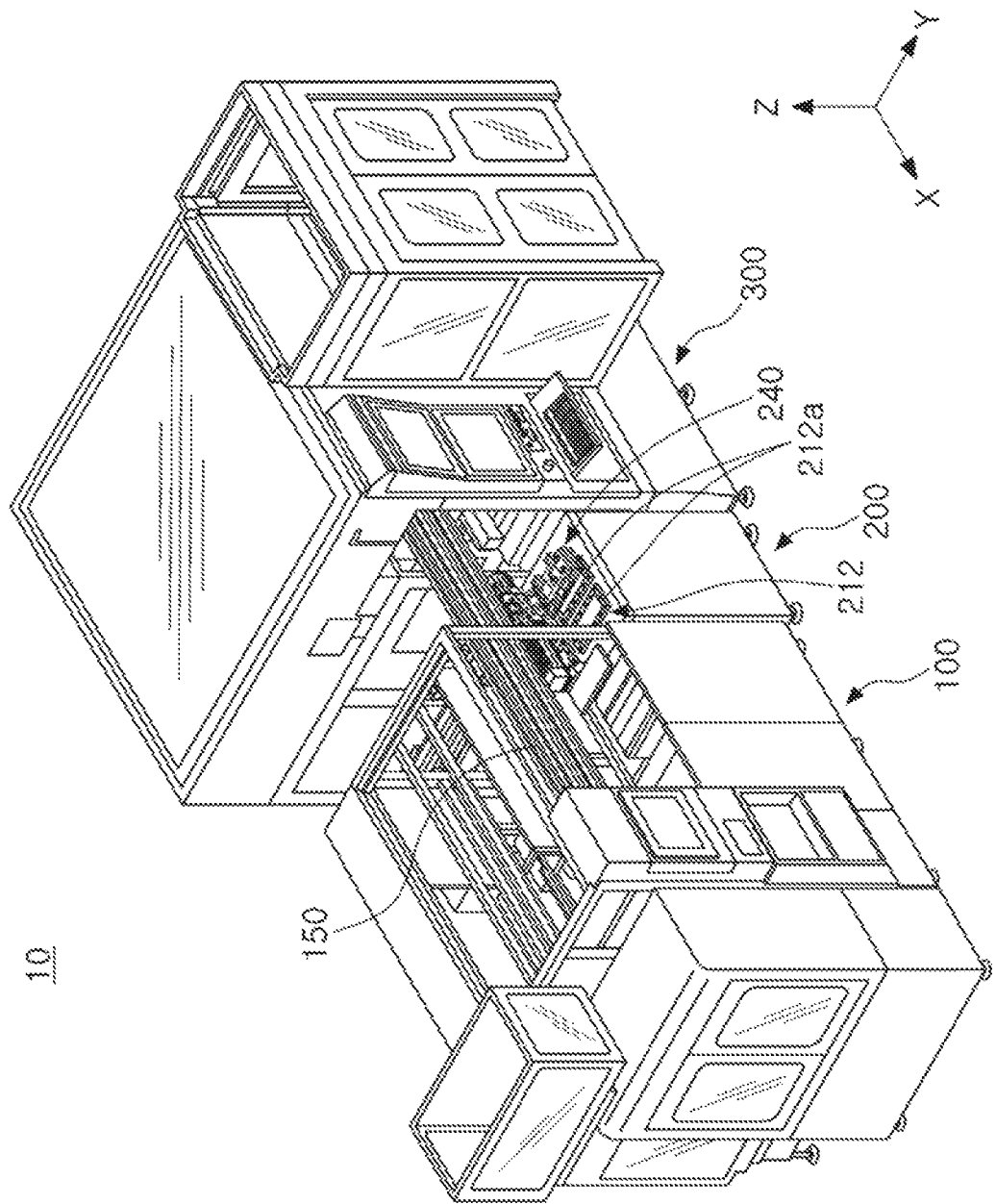
FIG. 1 is a schematic perspective view illustrating a semiconductor package sawing device according to exemplary embodiments of the present inventive concept.
Figure 2:
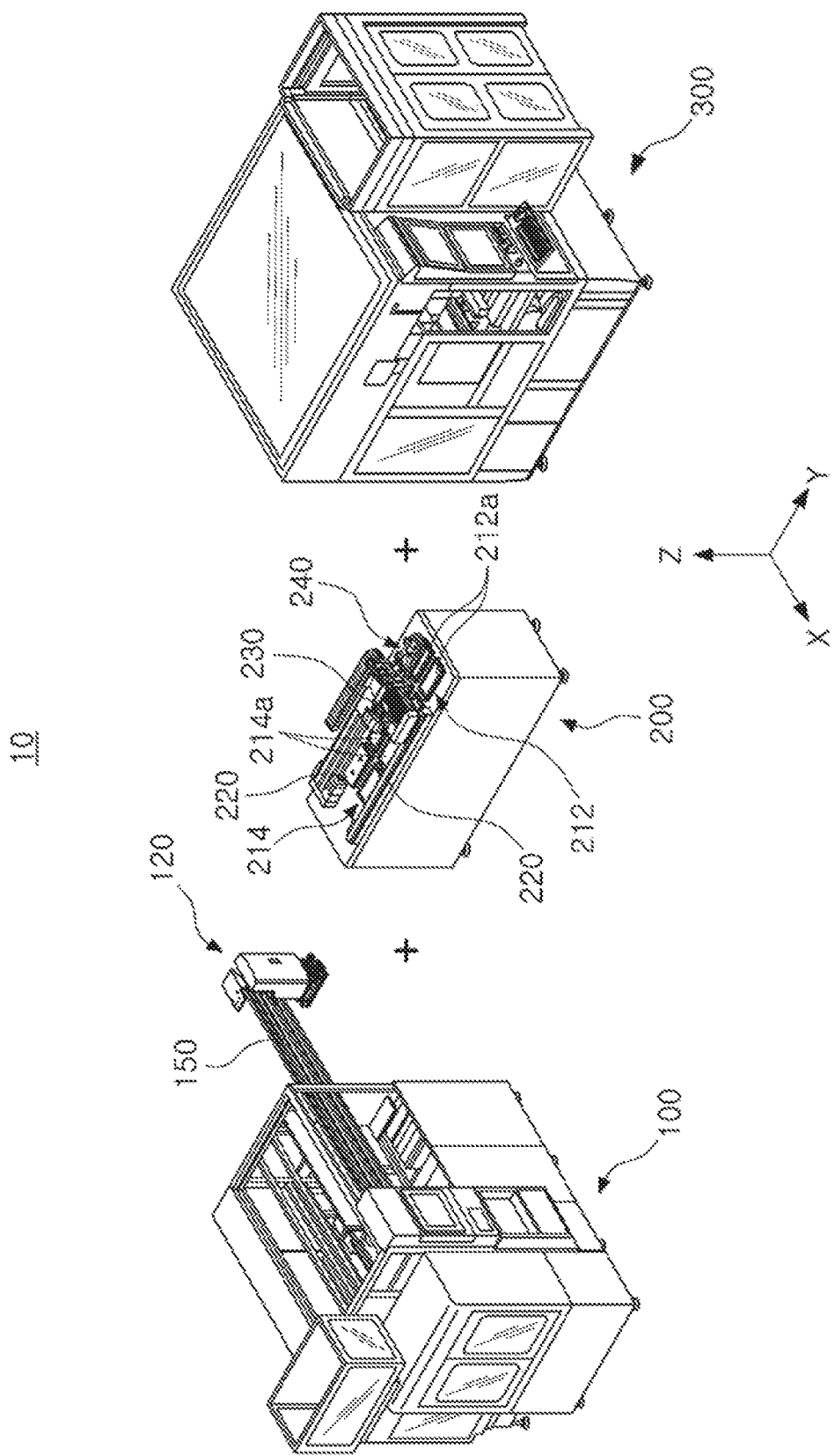
FIG. 2 is a schematic exploded perspective view illustrating a semiconductor package sawing device according to exemplary embodiments of the present inventive concept.
Figure 3:
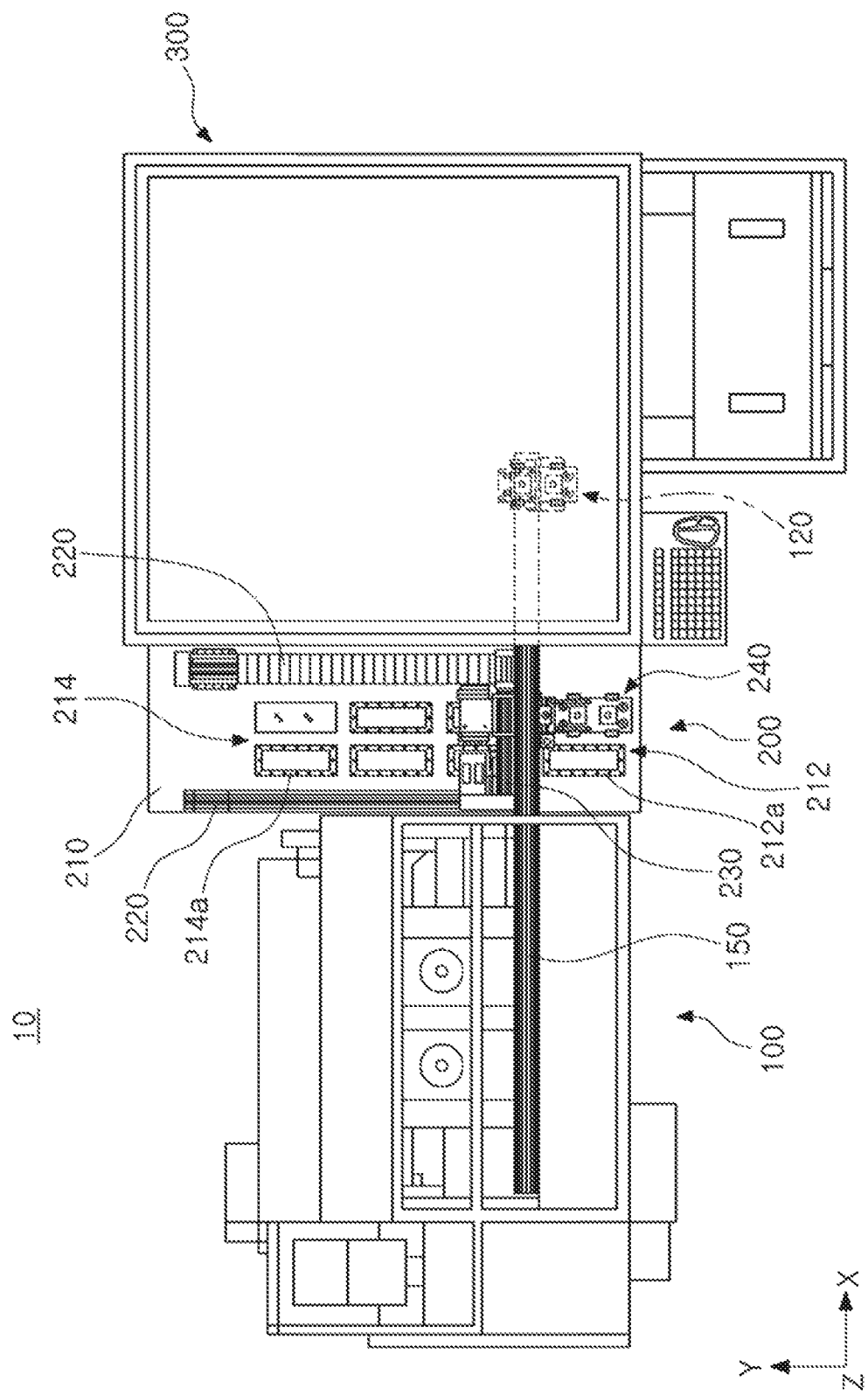
FIG. 3 is a schematic plan view illustrating a semiconductor package sawing device according to exemplary embodiments of the present inventive concept.

FIG. 1 is a schematic perspective view illustrating a semiconductor package sawing device according to exemplary embodiments of the present inventive concept. FIG. 2 is a schematic exploded perspective view illustrating a semiconductor package sawing device according to exemplary embodiments of the present inventive concept. FIG. 3 is a schematic plan view illustrating a semiconductor package sawing device according to exemplary embodiments of the present inventive concept.

Referring to FIGS. 1 to 3, for example, a semiconductor package sawing device 10 may include a semiconductor package sawing unit 100, an automatic tool providing portion 200, and a semiconductor package alignment portion 300.

The semiconductor package sawing unit 100 may be disposed on one side of the automatic tool providing portion 200, and may serve to divide a plurality of integrally formed semiconductor packages into unit semiconductor packages.

The semiconductor package sawing unit 100 may be provided with a plurality of chuck tables 110 (See FIG. 4), in which a chuck for a semiconductor package 410 (See FIG. 4) may be detachably installed. The chuck for the semiconductor package 410 and the chuck table 110 will be described in further detail later on herein.

As illustrated in FIG. 2, the semiconductor package sawing unit 100 may include a pickup unit 120 for transferring the chuck for a semiconductor package 410 (See FIG. 4) and a guide member for a pickup unit 150 for guiding movement of the pickup unit 120. The pickup unit 120 may transfer the chuck for a semiconductor package 410 from the semiconductor package sawing unit 100 to the automatic tool providing portion 200, or to the semiconductor package alignment portion 300, or may transfer the chuck for a semiconductor package 410 from the automatic tool providing portion 200 to the semiconductor package sawing unit 100 by moving along the guide member for a pickup unit 150 in an X-direction. According to an exemplary embodiment of the present inventive concept, the guide member for the pickup unit 150 may include at least one linear motion (LM) guide. However, the inventive concept is not limited thereto. For example, the guide member for a pickup unit 150 may be configured to permit the pickup unit 120 to move in two or three dimensions. The pickup unit 120 will be described in further detail later on herein.

The automatic tool providing portion 200 may store various types of chucks for a semiconductor package 410 to be attached or detached to/from the semiconductor package sawing unit 100 and place a chuck for a semiconductor package 410 into a position for transfer by the pickup unit 120.

The automatic tool providing portion 200 may include a main body 210 (See FIG. 3) including a substantially rectangular parallelepiped shape. The main body 210 may include a supply area 212 in which a chuck for a semiconductor package 410 used for the semiconductor package sawing unit 100 is aligned. A storage area 214 in which various types of chucks for a semiconductor package 410 are stored may be provided in a rear end of the supply area 212. Fixing chucks 212a and 214a may be included in the supply area 212 and the storage area 214, respectively, to secure the chuck for a semiconductor package 410. For example, the fixing chucks 212a and 214a may fix the chuck for a semiconductor package 410 by use of suction.

A first guide member 220 may be included within the main body 210 and at an edge thereof. For example, the first guide member 220 may be disposed on an edge of a side surface of the main body 210 with a length that extends in a Y-direction. The first guide member 220 may refer to a pair of first guide members 220.

The automatic tool providing portion 200 may include a transfer unit 240 capable of being moved in the X-direction, and the Y-direction along the first guide member 220. The transfer unit 240 may be installed on the second guide member 230 which may be installed on the first guide member 220, and may be moved in the Y-direction. The transfer unit 240 may transfer the chuck for a semiconductor package 410 to and from the storage area 214 and the supply area 212.

The automatic tool providing portion 200 will be described in detail later on herein.

The semiconductor package alignment portion 300 may be disposed on a different side of the automatic tool providing portion 200 from the semiconductor package sawing unit 100. For example, the semiconductor package sawing unit 100 and the package alignment portion 300 may be disposed on opposite sides of the tool providing portion 200. The semiconductor package alignment portion 300 may align a plurality of individual semiconductor packages cut from a plurality of integrally manufactured semiconductor packages before the plurality of individual semiconductor packages are transferred to an inspection process. The individual semiconductor package, cut by the semiconductor package sawing unit 100, may be transferred to the semiconductor package alignment portion 300 by the pickup unit 120 while still mounted on the chuck for a semiconductor package 410.

The semiconductor package sawing unit 100, the automatic tool providing portion 200, and the semiconductor package alignment portion 300 may all be connected to a control unit. The pickup unit 120, the transfer unit 240 as well as other components described above may also be controlled by the control unit.

Although the automatic tool providing portion 200 is shown disposed between the semiconductor package sawing unit 100 and the semiconductor package alignment portion 300, the inventive concept is not limited thereto. For example, a placement position of the automatic tool providing portion 200 may be variously changed.

An operation of the semiconductor package sawing device 10 according to an exemplary embodiment of the present inventive concept will be briefly described hereafter.

A plurality of integrally manufactured semiconductor packages are supplied to the semiconductor package sawing device 10. A type of the integrally manufactured semiconductor package supplied may be variously changed. Thus, depending on a type of the semiconductor package supplied, a change may be required in the chuck for a semiconductor package 410 in which a semiconductor package is mounted.

When it is determined that replacing the chuck for a semiconductor package 410 is required, the control unit may transfer the chuck for a semiconductor package 410 from the chuck table 110 (installed on the semiconductor package sawing unit 100) to the supply area 212 of the automatic tool providing portion 200 via the pickup unit 120 of the semiconductor package sawing unit 100.

The chuck for a semiconductor package 410, transferred to the supply area 212, may then be transferred to the storage area 214 by the transfer unit 240. The transfer unit 240 may transfer a chuck for a semiconductor package 410 from the storage area 214 to the supply area 212 according to a signal from the control unit.

The pickup unit 120 may transfer the chuck for a semiconductor package 410 from the supply area 212 to the semiconductor package sawing unit 100, and then the pickup unit 120 may mount the chuck for a semiconductor package 410 on the chuck table 110.

Then, the integrally manufactured semiconductor package to be supplied is mounted on the chuck for a semiconductor package 410, and a sawing process is performed.

Then, the chuck for semiconductor package 410, on which a cut semiconductor package is mounted, is provided to the semiconductor package alignment portion 300 by the pickup unit 120.

As described above, when a chuck for a semiconductor package 410 on which a semiconductor package is mounted is replaced, a chuck for a semiconductor package 410 may be automatically changed by the semiconductor package sawing device 10 without requiring manual work of the operator.

Hereinafter, individual configurations provided in the semiconductor package sawing device 10 will be described in further detail with reference to the corresponding drawings.

Figure 4:
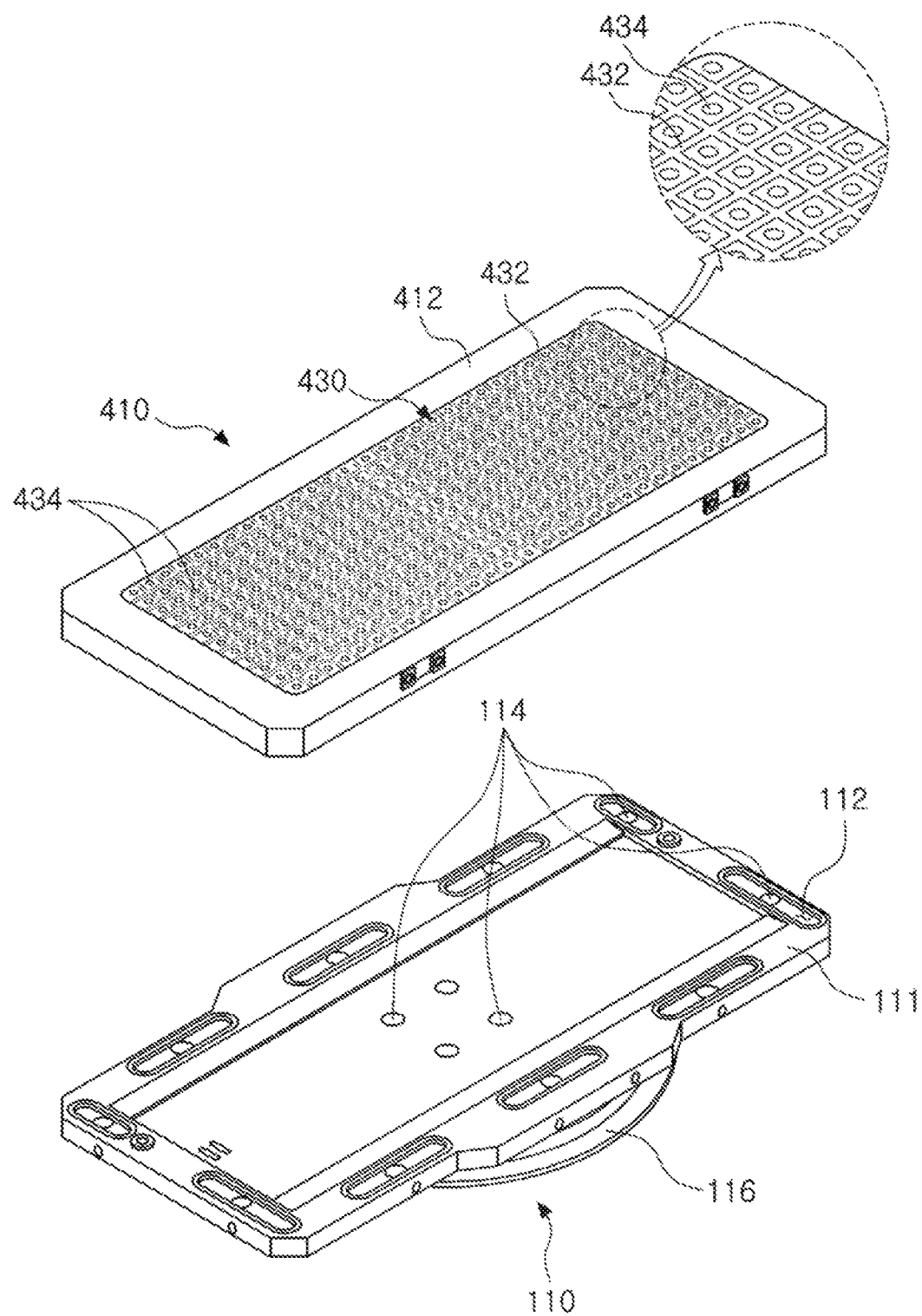
FIG. 4 is an exploded perspective view of a chuck table and a chuck for a semiconductor package according to an exemplary embodiment of the present inventive concept.

FIG. 4 is an exploded perspective view of a chuck table 110 and a chuck for a semiconductor package 410, and FIG.

5 is an exploded perspective view of a chuck table 110 and a chuck for a semiconductor package 410 viewed from a different angle than FIG. 4.

Figure 5:
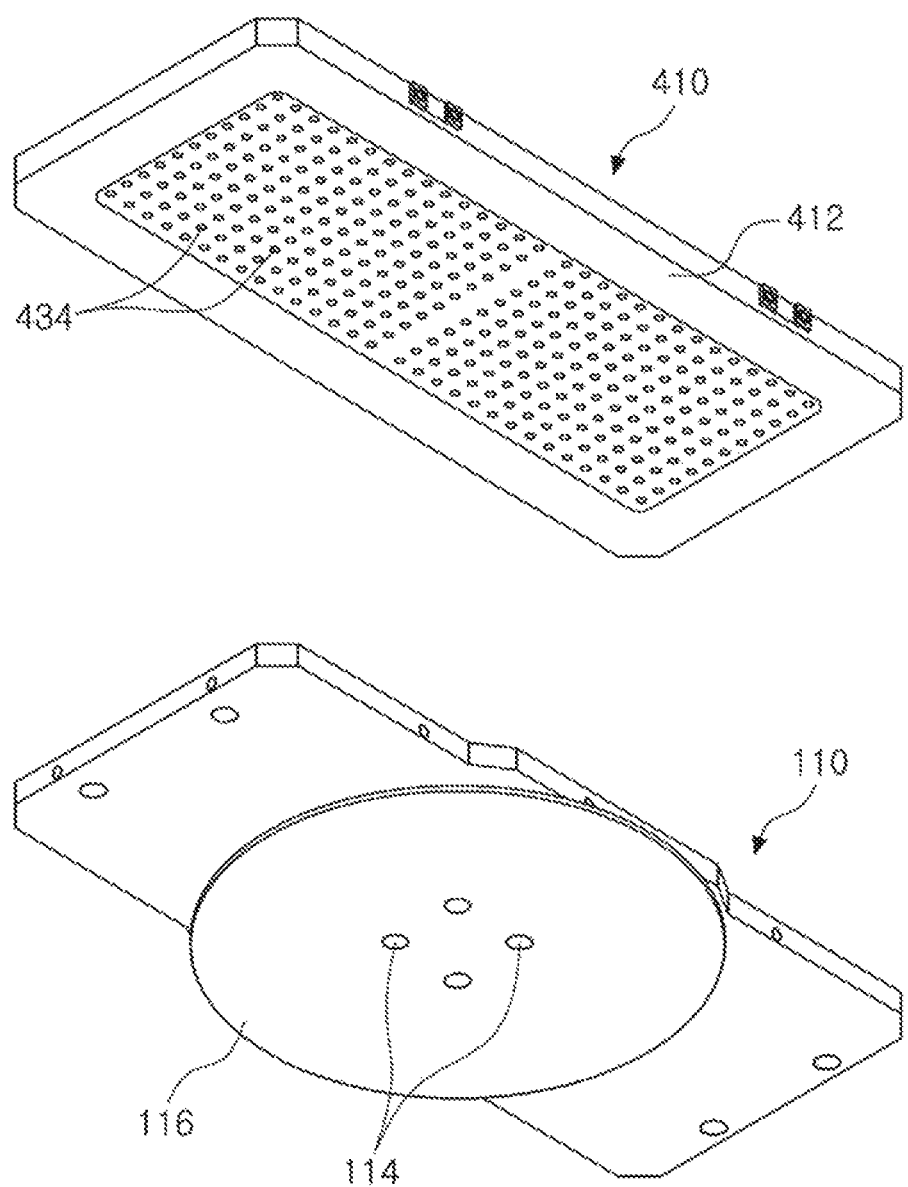
FIG. 5 is an exploded perspective view of a chuck table and a chuck for a semiconductor package according to an exemplary embodiment of the present inventive concept viewed from a different angle than FIG. 4.

Referring to FIGS. 4 and 5, the chuck table 110 may have a substantially quadrangular plate shape, but the inventive concept is not limited thereto. According to an exemplary embodiment of the present inventive concept, the chuck table 110 may include a vacuum forming groove 112 and a sucking hole 114. The suction hole 114 may absorb the chuck for a semiconductor package 410 to the chuck table 110 by suction force.

A plurality of vacuum forming grooves 112 may be disposed to be spaced apart from each other around edge portions of the chuck table 110. When the chuck for a semiconductor package 410 is mounted and installed, a bottom surface of the chuck for a semiconductor package 410 and the vacuum forming groove 112 may form an internal space. The vacuum forming groove 112 may be formed in a frame portion 111 of the chuck table 110, and may be formed to be stepped, in an edge of the chuck table 110. For example, the vacuum forming groove 112 may be a recessed space of the chuck table 110. In addition, a plurality of sucking holes 114 are provided, and some of the plurality of sucking holes 114 may be disposed in the vacuum forming groove 112. In addition, the remainder of the sucking holes 114 may be disposed inside of the frame portion 111. For example, the remainder of the sucking holes 114 may be disposed in a central area of the chuck table 110.

When the chuck for a semiconductor package 410 is mounted on the chuck table 110, while air is sucked through the sucking hole 114, a vacuum is formed in an internal space formed between the chuck for a semiconductor package 410 and the chuck table 110. Thus, the chuck for a semiconductor package 410 is fixed to and installed in the chuck table 110.

Then, when the chuck for a semiconductor package 410 is separated from the chuck table 110, air suction through an inlet for a sucking hole 114 is released, so that the chuck for a semiconductor package 410 may be easily separated from the chuck table 110.

In addition, the chuck table 110 may be provided with a disc portion 116 having a disc shape. A vacuum line for suction of air may be connected to the disc portion 116.

A chuck unit for a semiconductor package 400 may be provided with a chuck for a semiconductor package 410, and a transferring auxiliary member 420, to be described later. Referring to FIGS. 4 and 5, the chuck for a semiconductor package 410 may have a quadrangular plate shape, by way of example, and a frame 412, corresponding to a frame portion 111 of the chuck table 110 provided in an edge of the chuck for a semiconductor package 410. In addition, a receiving portion 430, on which a plurality of semiconductor packages are mounted, may be provided inside the frame 412. In addition, a guide groove 432 for cutting a semiconductor package may be formed in the receiving portion 430. In addition, a through hole 434 for preventing separation of a cut unit semiconductor package may be disposed in the receiving portion 430. For example, when air is sucked through the sucking holes 114 of the chuck table 110, while air flows out through the through hole 434, the unit semiconductor package, having been cut, may be fixed to the receiving portion 430.

Figure 6:
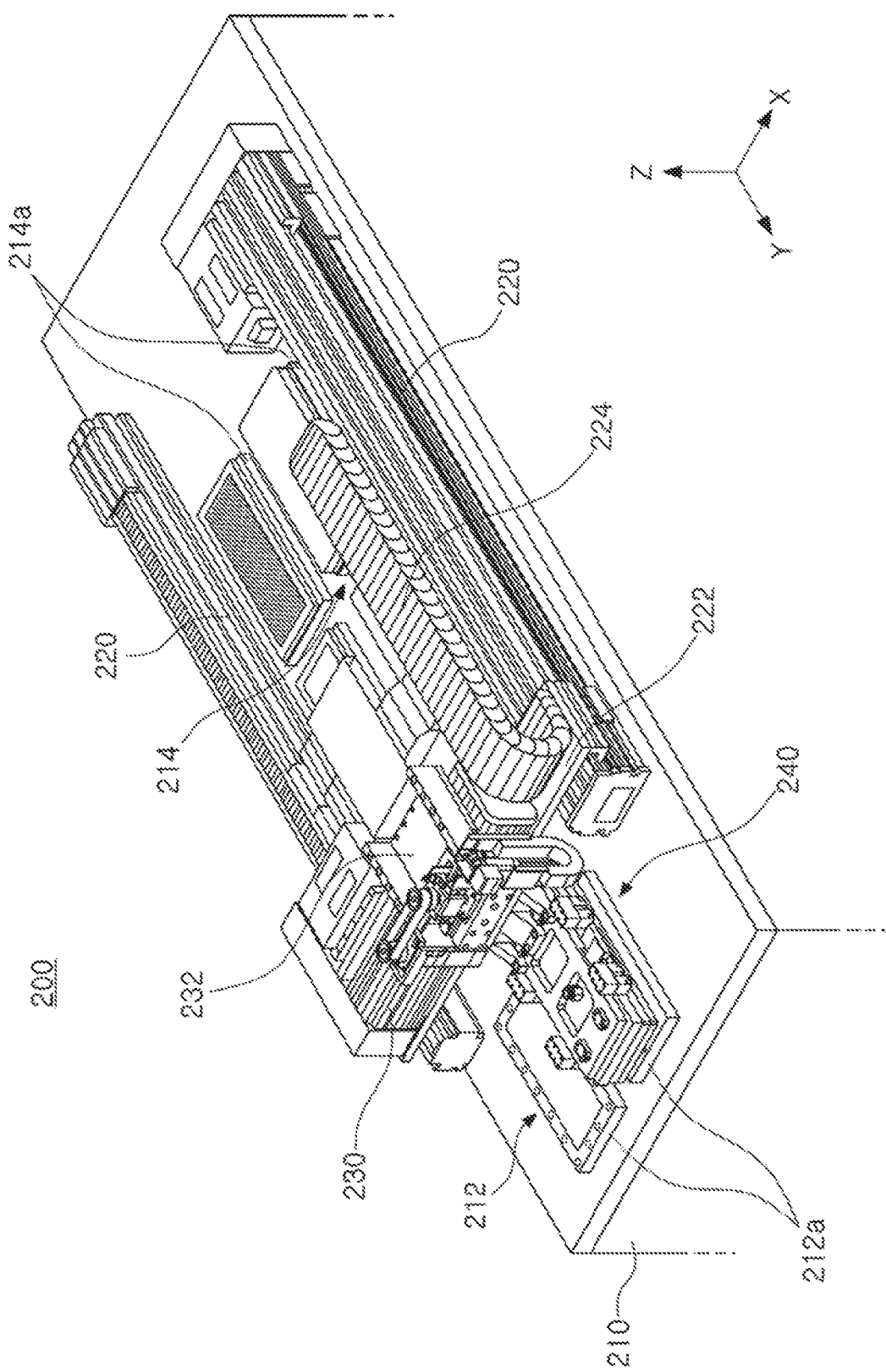
FIG. 6 is a partially enlarged view illustrating an automatic tool providing portion according to an exemplary embodiment of the present inventive concept.
Figure 7:
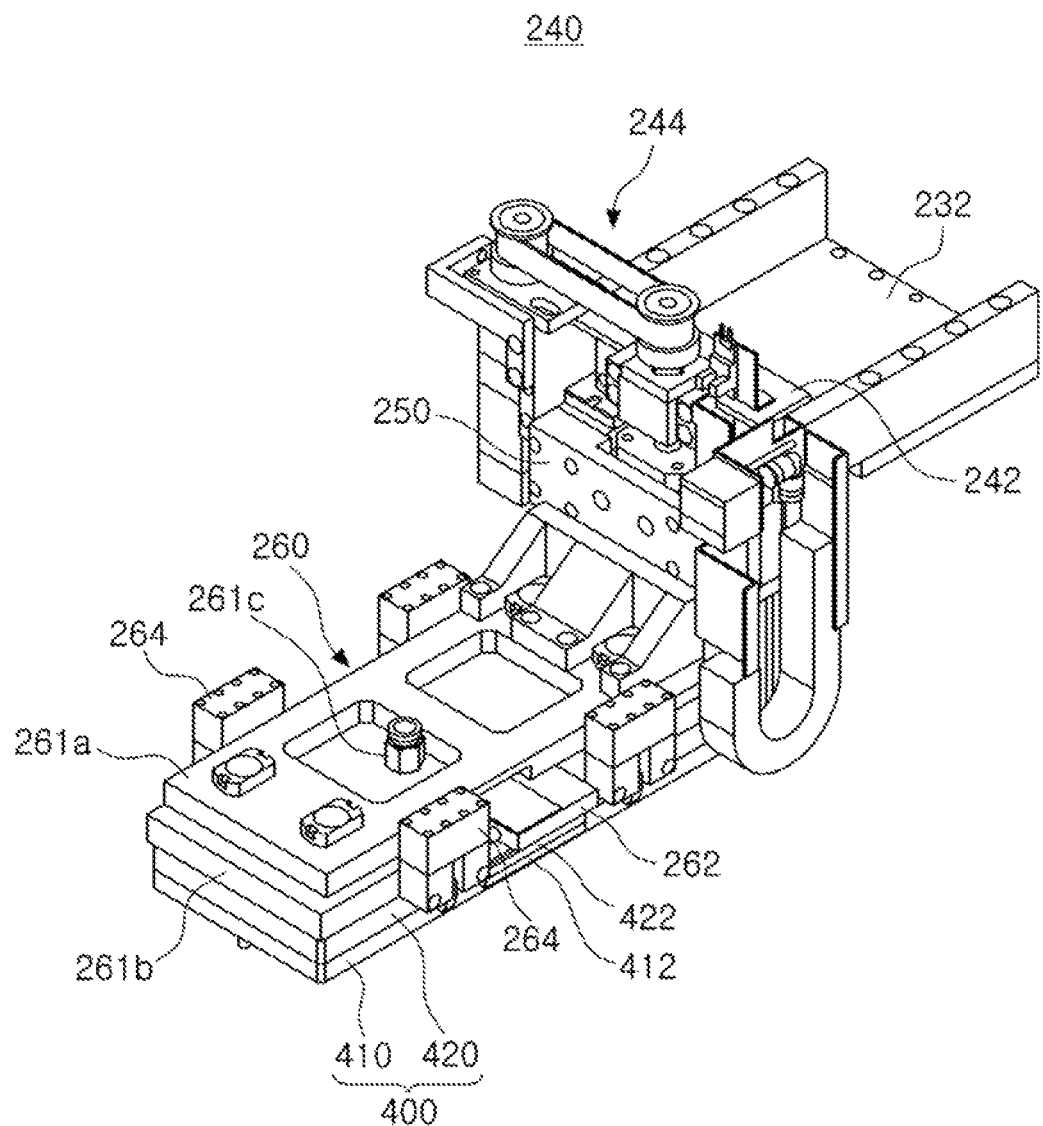
FIG. 7 is an enlarged view illustrating a transfer unit of an automatic tool providing portion according to an exemplary embodiment of the present inventive concept.
Figure 8:
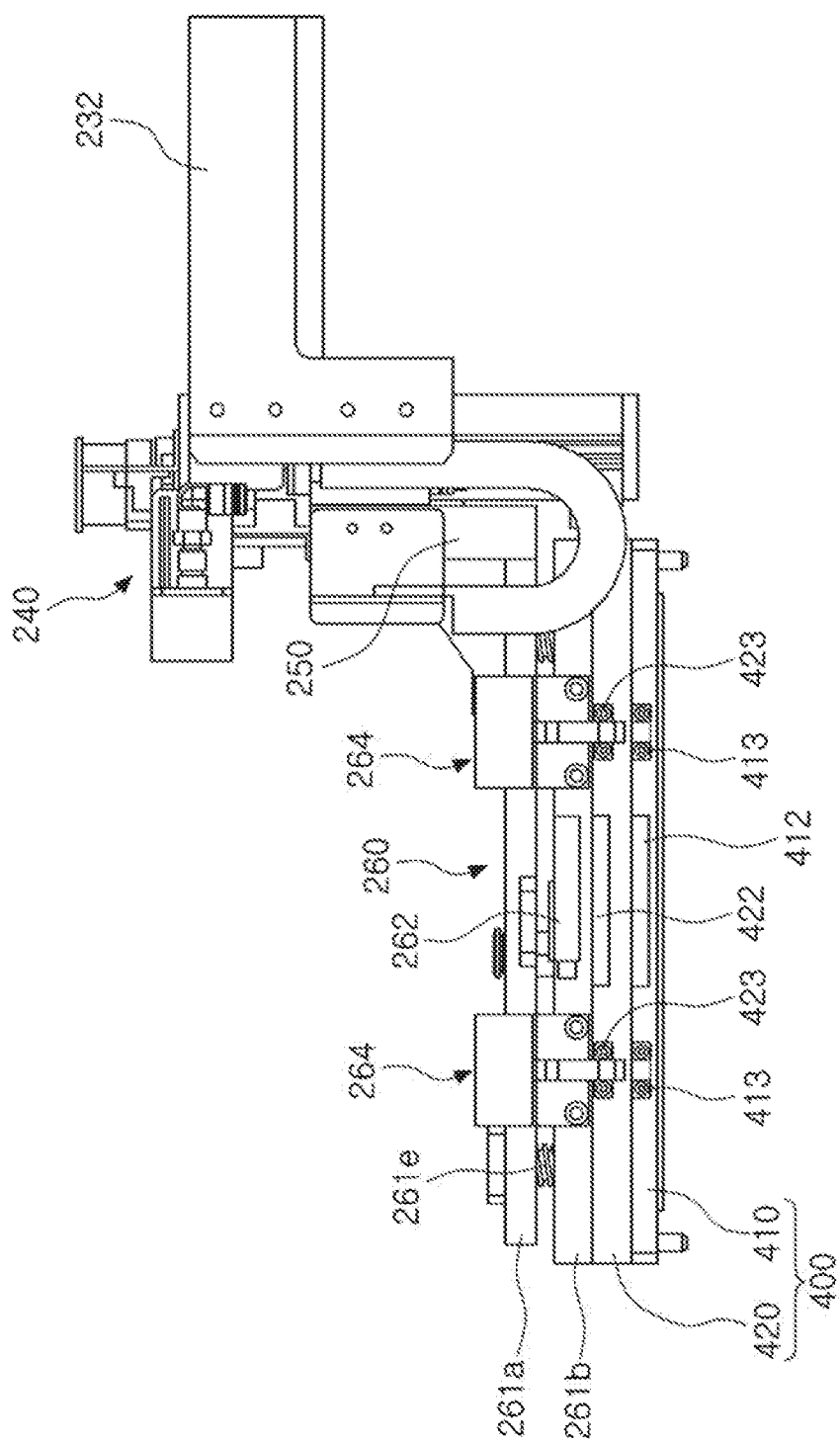
FIG. 8 is a side view illustrating a transfer unit of an automatic tool providing portion according to an exemplary embodiment of the present inventive concept.

FIG. 6 is a partially enlarged view illustrating an automatic tool providing portion 200, FIG. 7 is an enlarged view illustrating a transfer unit 240 of an automatic tool providing portion 200, and FIG. 8 is a side view illustrating a transfer unit 240 of an automatic tool providing portion 200.

Referring to FIGS. 6 to 8, the automatic tool providing portion 200, as briefly described above, includes a main body 210, a first guide member 220, a second guide member 230, and a transfer unit 240.

Various types of chuck units for a semiconductor package 400 may be mounted and installed on an upper surface of the main body 210. A supply area 212 in which the chuck unit for a semiconductor package 400 used for the semiconductor package sawing unit 100 (See FIG. 1) is aligned, and a storage area 214 which may be disposed adjacent to an end of the supply area 212 in which various types of chuck units fir a semiconductor package 400 are stored, are provided. For example, the supply area 212 is disposed at a front end portion of an upper surface of the main body 210, and the storage area 214 is disposed between first guide members 220. Fixing chucks 212a and 214a for securing the chuck unit for a semiconductor package 400 by suction force may be provided in the supply area 212 and the storage area 214, respectively.

Two first guide members 220 may be provided as a pair substantially in parallel to one another, but the inventive concept is not limited thereto. The first guide member 220 may be disposed with a length extending in the Y-direction of an edge of an upper surface of the main body 210. In addition, a first moving member 222 may be installed on the first guide member 220 and the first moving member 222 may be connected to a second guide member 230 and a transfer unit 240. The first moving member 222 may move along the length of the first guide member 220. Thus the second guide member 230 and the transfer unit 240 connected to the first moving member 222 may also move in the Y-direction. A first driving force transmitting member 224 may be connected to the first moving member 222 transmitting a driving force. The first driving force transmitting member 224 transmits the driving force, generated from a driving, source to the first moving member 222, and thus the first moving member 222 may move on the first guide member 220.

The second guide member 230 is installed on the first moving member 222, and is disposed to have a length extending in the X-direction. The second moving member 232 is installed on the second guide member 230, and the transfer unit 240 is installed on the second moving member 232. In other words, the second moving member 232 moves along the length of the second guide member 230, and thus the transfer unit 240 may also move in the X-direction. A second driving force transmitting member transmitting a driving force may be connected to the second moving member 232, the second driving force transmitting member may transmit a driving force generated from a driving source to the second moving member 232. Thus the second moving member 232 may move on the second guide member 230.

The transfer unit 240 may be installed on the second moving member 232, and may transfer the chuck unit for a semiconductor package 400 (See FIG. 9) mounted on the supply area 212 of the main body 210 to the storage area 214, or transfer the chuck unit for a semiconductor package 400 mounted on the storage area 214 to the supply area 212.

The transfer unit 240 may include a fixed portion 242 installed on the second moving member 232, a connection portion 250 installed on the fixed portion 242 to be lifted, and a mounting member 260 installed on the connection portion 250 in which the chuck unit for a semiconductor package 400 may be detachably installed. The fixed portion 242 may include a driving unit 244 for lifting the connection portion 250. The driving unit 244 may include a motor, a pulley, a belt, or a similar mechanism. The mounting member 260 may be connected to and lifted together with the connection portion 250. The mounting member 260 may be lifted to detach the chuck unit for a semiconductor package 400. In addition, the mounting member 260 may include a support 261a coupled to the connection portion 250, and a suction portion 261b installed at a lower end of the support 261a. The suction portion 261b may have a substantially flat plate shape. In addition, the suction portion 261b may include a connector 261c to connect to a vacuum line. Furthermore, the suction portion 261b may be provided with a flow path. For example, the suction portion 261b may be connected to the connector 261c through which air flows. As described above, while suction force is applied to the mounting member 260, the chuck for a semiconductor package 410 and/or the transferring auxiliary member 420 may be secured to a lower surface of the mounting member 260. A spring 261e may be installed between the support 261a and the suction portion 261b, thereby absorbing vibrations generated when the chuck unit for a semiconductor package 400 is mounted.

In addition, the mourning member 260 may include a recognition portion 262 installed on a side surface. In more detail, the recognition portion 262 may be provided on a side surface of the suction portion 261b. The recognition portion 262 may be disposed to oppose members for recognition 422 provided on the chuck for a semiconductor package 410 and/or the transferring auxiliary member 420, of the chuck unit for a semiconductor package 400. In addition, the members for recognition 422 may include radio frequency identification (RFID), two-dimensional (2D) barcode, three dimensional (3D) barcode or other distinctive markings discernible by the recognition portion 262, In addition, the recognition portion 262 may connect to the control unit. For example, the control unit may signal for the transferring auxiliary member 420 and/or the chuck for a semiconductor package 410 to be absorbed by the mounting member 260 according to input received, such as information from the recognition portion 262 about the identity of a chuck corresponding to detected members for recognition 422.

In addition, a first separation prevention member 264 may be installed on each of both side surfaces of the mounting member 260. In other words, the first separation prevention member 264 may be installed on, both side surfaces of a support 261a. The first separation prevention member 264 will be described in detail later on herein.

Referring to FIG. 9, the chuck unit for a semiconductor package 400 will be described. The chuck unit for a semiconductor package 400 may include a transferring auxiliary member 420 installed on the mounting member 260 and/or the pickup unit 120, and may mount the chuck for a semiconductor package 410. The transferring auxiliary member 420 may include a plurality of types to correspond to various types of chucks that may be used for a semiconductor package 410. In other words, the chuck for a semiconductor package 410 may include various types, and thus the transferring auxiliary member 420, corresponding thereto, may also include various types.

The transferring auxiliary member 420 may be installed on the pickup unit 120 when the chuck for a semiconductor package 410 is transferred to the semiconductor package alignment portion 300. After being cut, a unit semiconductor package may be mounted on the chuck for a semiconductor package 410. In this case, the chuck for a semiconductor package 410 may be absorbed to a lower surface of the transferring auxiliary member 420.

In other words, the pickup unit 120 may absorb and transfer the chuck for a semiconductor package 410 when the chuck for a semiconductor package 410 is transferred between the semiconductor package sawing unit 100 and the automatic tool providing portion 200. In addition, when the chuck for a semiconductor package 410 is transferred from the semiconductor package sawing unit 100 to the semiconductor package alignment portion 300 while a cut unit semiconductor package is still mounted, the pickup unit 120 may absorb the chuck for a semiconductor package 410 while the transferring auxiliary member 420 is installed. The transferring auxiliary member 420 may be provided with an air flow path 424 in which air flows to suction the chuck for a semiconductor package 410 and a unit semiconductor package mounted on the chuck for a semiconductor package 410.

In addition, locking members 413 and 423 may be provided on side surfaces of the chuck for a semiconductor package 410 and the transferring auxiliary member 420 to prevent separation of the chuck unit for a semiconductor package 400 when the chuck unit for a semiconductor package 400 is transferred by the pickup unit 120 and the transfer unit 240. A plurality of locking members 413 and 423 may be spaced apart from each other. For example, the locking members 413 and 423 may each be provided as a pair of locking members disposed on side surfaces of the chuck for a semiconductor package 410 and the transferring auxiliary member 420.

In other words, the chuck for a semiconductor package 410 is only mounted on the mounting member 260 or the pickup unit 120. Alternatively, after the transferring auxiliary member 420 is installed, the chuck for a semiconductor package 410 may then be mounted thereon.

Figure 10:
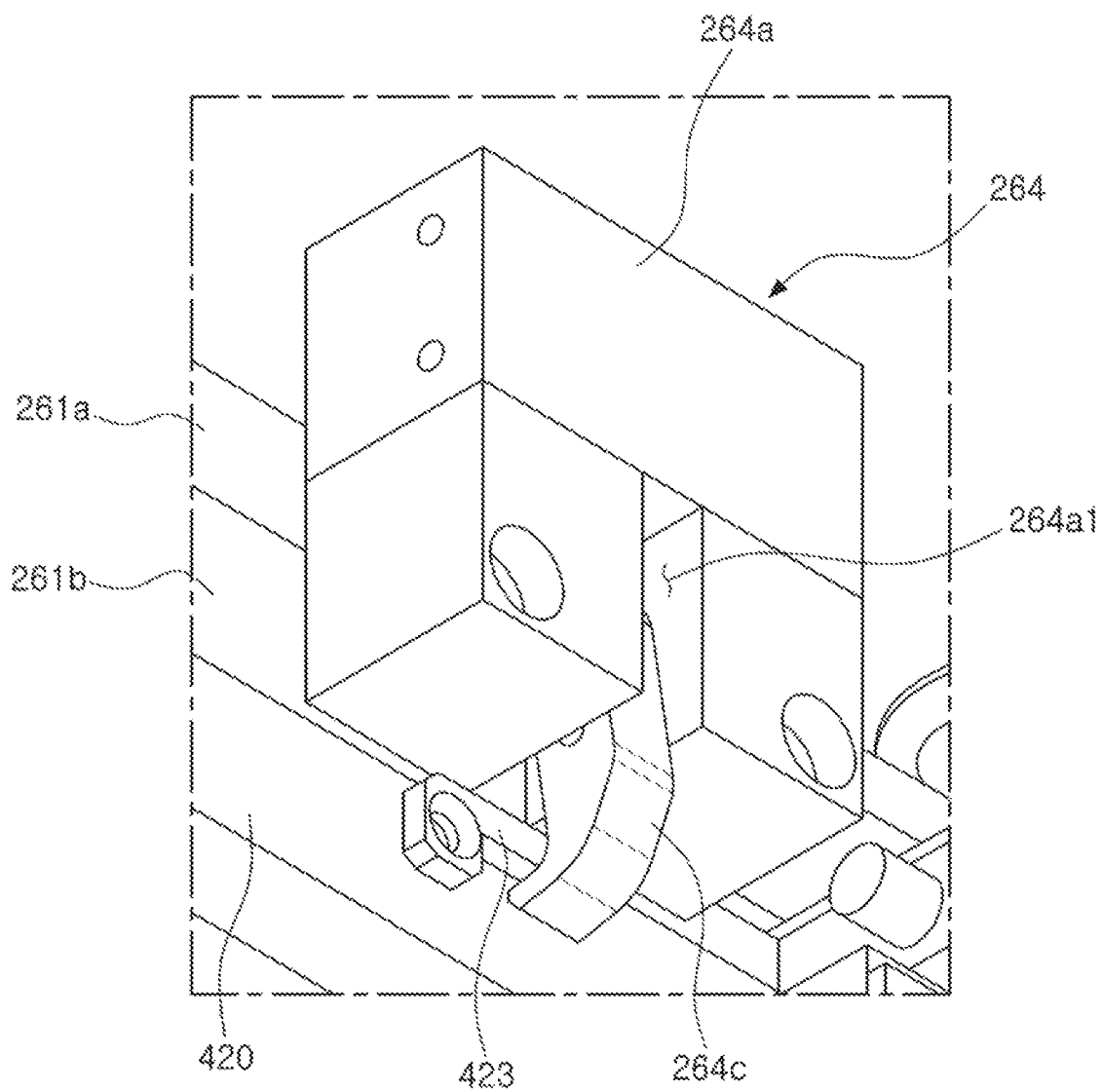
FIG. 10 is an enlarged perspective view illustrating a first separation prevention member according to an exemplary embodiment of the present inventive concept.
Figure 11:
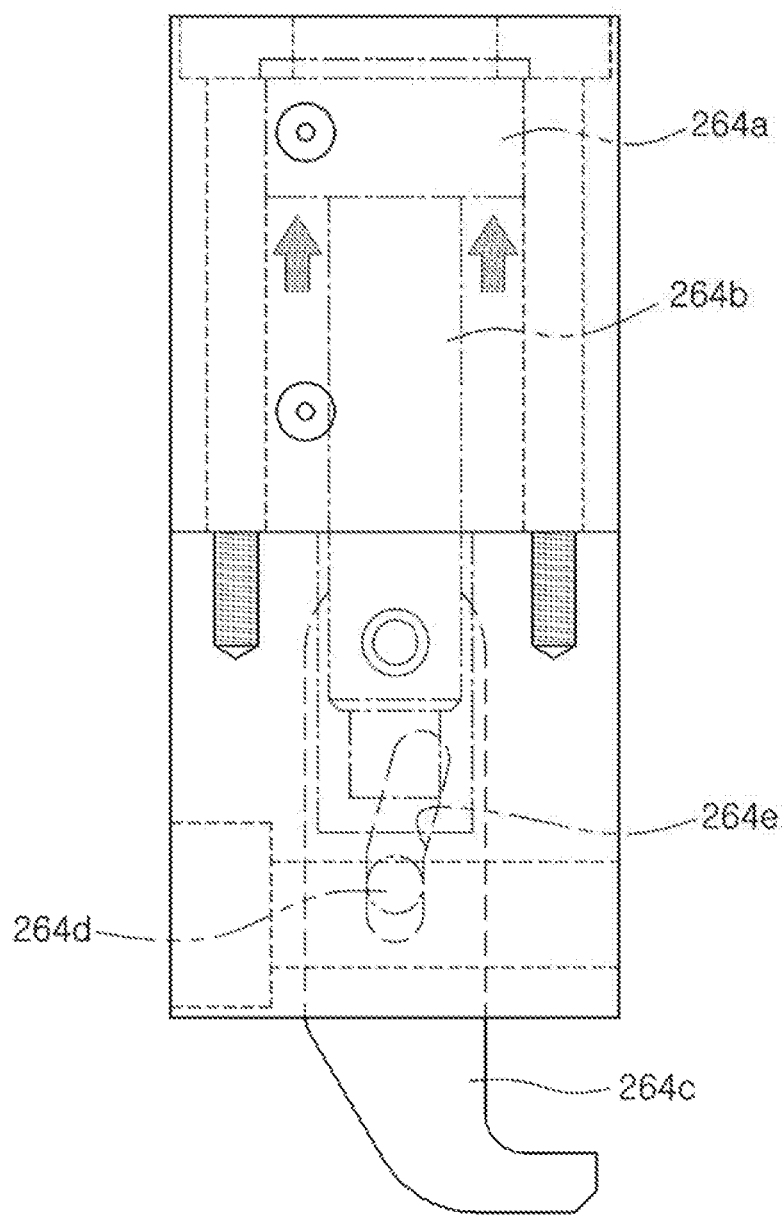
FIG. 11 is a side view illustrating a first separation prevention member according to an exemplary embodiment of the present inventive concept.

FIG. 10 is an enlarged perspective view illustrating a first separation prevention member 264, and FIG. 11 is a side view illustrating a first separation prevention member 264.

The first separation prevention member 264 may include a body 264a, a lifting portion 264b installed in the body 264a to be lifted, and a hook 264c connected to an end of the lifting portion 264b. A guide hole 264e may be formed in the hook 264c, and a guide bar 264d included in the body 264a may be coupled to the guide hole 264e.

The body 264a may have a substantially rectangular parallelepiped shape, and may have an internal space. An installation groove 264a1 may be disposed in the body 264a into which the hook 264c is inserted. The lifting portion 264b may have a piston shape, and may include two lifting portions disposed at both sides of the internal space of the body 264a. A hook 264c is connected to the lifting portion 264b. Thus, as the lifting portion 264b is lifted, the hook 264c may rotate. In other words, when the lifting portion 264b is lifted, the guide hole 264e of the hook 264c may be guided by the guide bar 264d, and thus the hook 264c is lifted and rotates. Thus, the hook 264c may be caught by the locking member 423 of the transferring auxiliary member 420, thereby preventing the transferring auxiliary member 420 from being separated from the mounting member 260. In addition, when only the chuck for a semiconductor package 410 is absorbed to the mounting member 260, the hook 264c is caught by the locking member 413 of the chuck for a semiconductor package 410, thereby preventing the chuck fir a semiconductor package 410 from being separated from the mounting member 260.

According to an exemplary embodiment of the present inventive concept, the lifting portion 264b may be lifted by air supplied from an external source.

Figure 12:
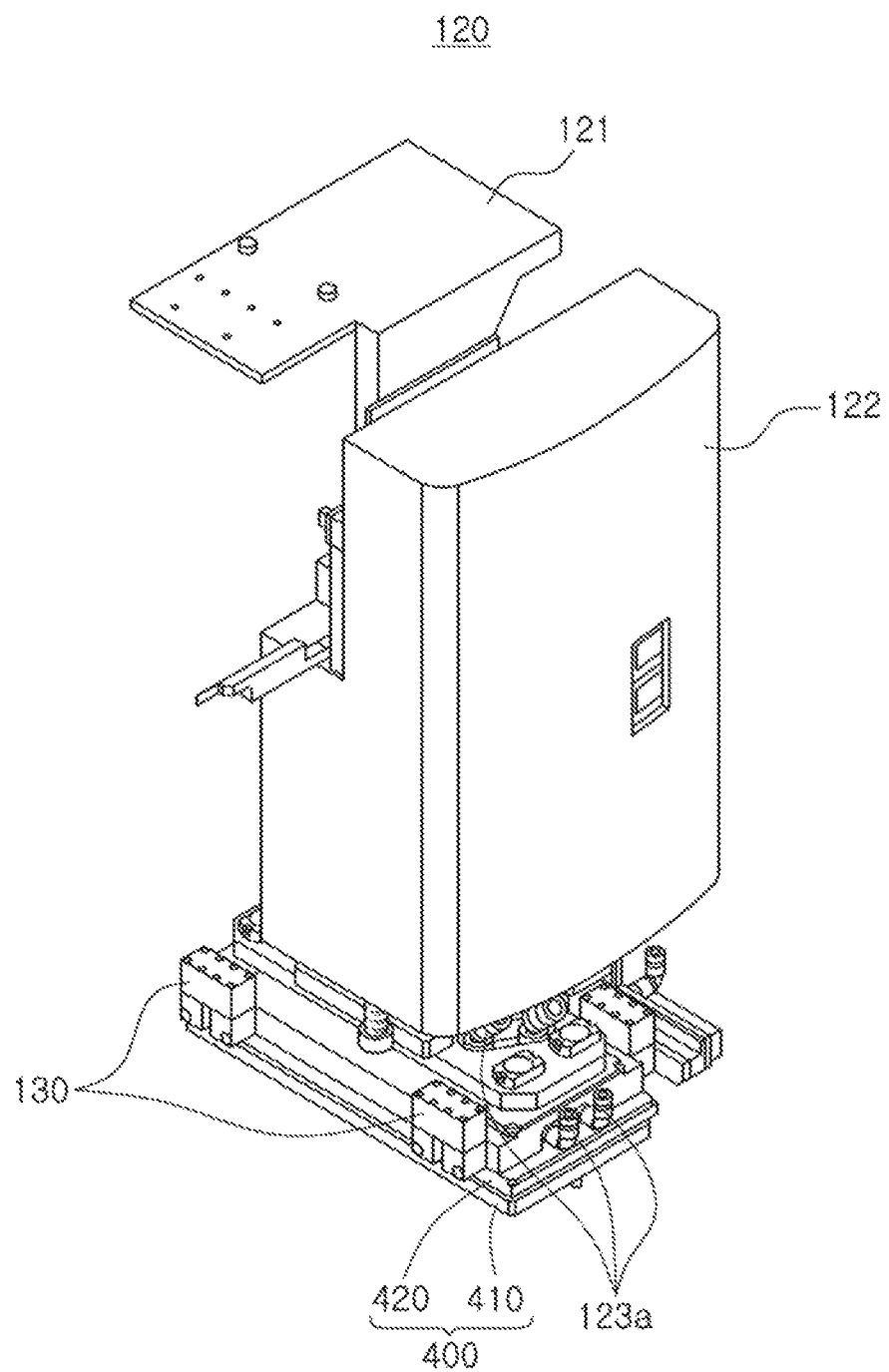
FIG. 12 is a schematic perspective view illustrating a pickup unit according to an exemplary embodiment of the present inventive concept.
Figure 13:
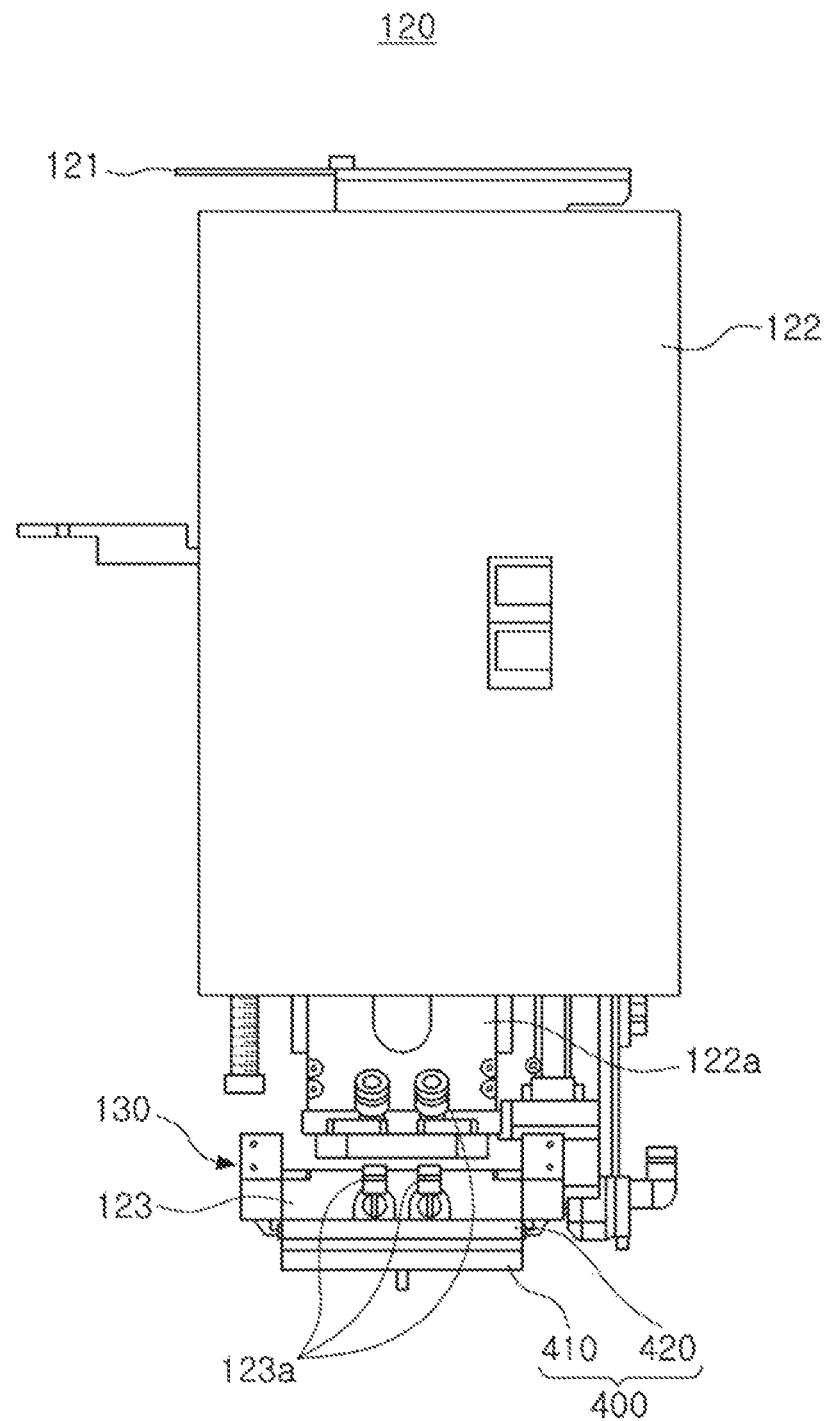
FIG. 13 is a front view illustrating a pickup unit according to an exemplary embodiment of the present inventive concept.

FIG. 12 is a schematic perspective view illustrating a pickup unit 120, and FIG. 13 is a front view illustrating a pickup unit 120.

Referring to FIGS. 12 and 13, the pickup unit 120 move along the guide member for a pickup unit 150 of the semiconductor package sawing device 100. The pickup unit 120 may include an installation member 121 installed to be slidably moved in the guide member for a pickup unit 150.

A pickup unit body 122 may be installed in the installation member 121. In addition, a mounting member for a pickup unit 123 may be lifted in the pickup unit body 122. For example, the mounting member for a pickup unit 123 may be installed on the lifting member 122a of the pickup unit body 122 so that the chuck for a semiconductor package 410 and the transferring auxiliary member 420 may be detached from the mounting member for a pickup unit 123. In other words, the mounting member for a pickup unit 123 may be lifted by the pickup unit body 122 to detach the chuck for a semiconductor package 410 and the transferring auxiliary member 420.

In addition, a vacuum line for suctioning air may be connected to the mourning member for a pickup unit 123. A connector 123a connected to a vacuum line may be included in the mounting member for a pickup unit 123. An air flow path, to which the connector 123a is connected, may be provided in the mounting member for a pickup unit 123. As described above, as suction force is applied to the mounting member for a pickup unit 123, the chuck for a semiconductor package 410 and/or the transferring auxiliary member 420 may be attached. In addition, a second separation prevention member 130 for preventing separation of the transferring auxiliary member 420 may also be provided in the mounting member for a pickup unit 120. The second separation prevention member 130 has the same configuration as that of the first separation prevention member 264 described above, so a detailed description thereof will be omitted herein for brevity of description. The second separation prevention member 130 may include a body having an internal space, a lifting, portion installed in the body to be lifted, and a hook disposed at an end of the lifting portion. A guide bar may be inserted into a guide hole disposed in the body in the hook.

As described above, the second separation prevention member 130 is provided in the mounting member for a pickup unit 120, and thus may prevent separation of the chuck for a semiconductor package 410 and/or the transferring auxiliary member 420 during transfer.

According to exemplary embodiments of the present inventive concept, as described above, a semiconductor package sawing device is provided that replaces chucks for a semiconductor package 410 (on which a semiconductor package may be mounted) automatically without necessitating manual change by the operator. Thus, automatic replacement of chucks by the semiconductor package sawing device for a semiconductor package 410 reduces replacement time and increases efficiency when different chucks or new chucks are needed, for example.

While exemplary embodiments of the present inventive concept have been shown and described above, it will be understood by one of ordinary skill in the art that variations in form and detail may be made therein without departing from the spirit and scope of the present disclosure, as defined by, the appended claims.

What is claimed is:

1. A semiconductor package sawing device, comprising:
   a semiconductor package sawing unit;
   an automatic tool providing portion disposed adjacent to the semiconductor package sawing unit; and
   a semiconductor package alignment portion,
   wherein the automatic tool providing portion includes a transfer unit for transferring a chuck unit to the semiconductor package sawing unit,
   wherein the transfer unit includes a mounting member that adsorbs the chuck unit for a semiconductor package by suction force,
   wherein the mounting member includes a first separation prevention member for preventing the chuck unit from separation from the mounting member,
   wherein the first separation prevention member includes:
   a body having an internal space;
   a lifting portion disposed inside the body and having a piston shape; and
   a hook connected to the lifting portion and exposed to an exterior of the body.

2. The semiconductor package sawing device of claim 1, wherein the mounting member includes a support, and a suction portion disposed at an end of the support.

3. The semiconductor package sawing device of claim 2, wherein the suction portion is provided with an air flow path.

4. The semiconductor package sawing device of claim 2, wherein a spring is disposed between the support and the suction portion.

5. The semiconductor package sawing device of claim 1, wherein the body includes a guide bar, and the guide bar is coupled to a guide hole disposed in the hook.

6. The semiconductor package sawing device of claim 1, wherein the mounting member includes a recognition portion for identifying the chuck unit.

7. The semiconductor package sawing device of claim 1, wherein the automatic tool providing portion includes:
   a main body having a supply area in which the chuck unit is aligned on an upper surface, and a storage area disposed adjacent to the supply area;
   a first guide member disposed at an edge of an upper surface of the main body; and
   a second guide member disposed on a first moving member of the first guide member;
   wherein the transfer unit is disposed on a second moving member of the second guide member.

8. The semiconductor package sawing device of claim 1, wherein the semiconductor package sawing unit includes a pickup unit disposed on a guide member for guiding a transfer path of the chuck unit.

9. The semiconductor package sawing device of claim 8, wherein the pickup unit includes:
   a pickup unit body; and
   a mounting member disposed in a lifting member of the pickup unit body,
   wherein the mounting member of the pickup unit includes a connector to which a vacuum line is connected.

10. The semiconductor package sawing device of claim 9, wherein both side surfaces of the mounting member of the pickup unit include a second separation prevention member for preventing separation of the chuck unit.

11. The semiconductor package sawing device of claim 10, wherein the second separation prevention member includes:
   a body having an internal space;
   a lifting portion disposed inside the body; and
   a hook connected to the lifting portion and exposed to an exterior of the body.

12. The semiconductor package sawing device of claim 11, wherein the body includes a guide bar, and the guide bar is travels along a guide hole path formed in the hook to rotate the hook.

13. The semiconductor package sawing device of claim 1, wherein the chuck unit includes a chuck for a semiconductor package in which a plurality of semiconductor packages are mounted, and a transferring auxiliary member is disposed on the chuck for the semiconductor package to transfer a plurality of cut semiconductor packages mounted on the chuck for the semiconductor package.

14. The semiconductor package sawing device of claim 13, wherein both side surfaces of the chuck for the semiconductor package and the transferring auxiliary member are provided with a locking member for preventing the chuck from separating from a Mounting member or a pickup unit during transfer.

15. The semiconductor package sawing device of claim 13, wherein the chuck for the semiconductor package includes a frame having a quadrangular ring shaped frame, and a receiving portion disposed inside the frame and having a plurality of through holes formed therein,
    wherein the receiving portion includes a guide groove for cutting a plurality of semiconductor packages during a sawing process.

16. The semiconductor package sawing device of claim 13, wherein the transferring auxiliary member includes the chuck for the semiconductor package and an air flow path for absorption of a plurality of cut semiconductor packages.

17. A semiconductor package sawing device, comprising:
a semiconductor package sawing unit;
an automatic tool providing portion disposed adjacent to the semiconductor package sawing unit and including a chuck supply area;
a fixing chuck disposed in the chuck supply area for securing a chuck;
a semiconductor package alignment portion disposed adjacent to the semiconductor package sawing unit or the automatic tool providing portion;
a transfer unit coupled to the automatic tool providing portion for transferring a chuck unit disposed on the fixing chuck;
a first mounting member coupled to the transfer unit;
a transferring auxiliary member detachably coupled to the first mounting member; and
a chuck recognition portion disposed at a side surface of the first mounting member,
wherein the semiconductor package sawing unit includes a pickup unit disposed on a guide member for guiding a transfer path of the chuck unit,
wherein the pickup unit includes:
a pickup unit body; and
a second mounting member disposed in a lifting member of the pickup unit body,
wherein the second mounting member includes a connector to which a vacuum line is connected,
wherein both side surfaces of the second mounting member include a separation prevention member for preventing separation of the chuck unit,
wherein the separation prevention member includes:
a body having an internal space;
a lifting portion disposed inside the body; and
a hook connected to the lifting portion and exposed to an exterior of the body.

\* \* \* \* \*